United States Patent
Zhang et al.

(10) Patent No.: US 11,036,291 B1
(45) Date of Patent: Jun. 15, 2021

(54) POLARIZATION-STABILIZED BEAM-SHAPING ILLUMINATOR

(71) Applicant: Facebook Technologies, LLC, Menlo Park, CA (US)

(72) Inventors: Qi Zhang, Kirkland, WA (US); Joseph S. Corry, Seattle, WA (US); Alexander Randon Cope, Seattle, WA (US); Maik Andre Scheller, Redmond, WA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/803,259

(22) Filed: Feb. 27, 2020

Related U.S. Application Data

(60) Provisional application No. 62/934,420, filed on Nov. 12, 2019.

(51) Int. Cl.
*G06F 3/13* (2006.01)
*H01S 5/02253* (2021.01)
(Continued)

(52) U.S. Cl.
CPC ......... *G06F 3/013* (2013.01); *G02B 27/0093* (2013.01); *G02B 27/0172* (2013.01); *G02B 27/0179* (2013.01); *H01S 5/026* (2013.01); *H01S 5/02253* (2021.01); *H01S 5/423* (2013.01); *H04N 5/2256* (2013.01); *G02B 2027/0178* (2013.01); *G02B 2027/0187* (2013.01)

(58) Field of Classification Search
None
See application file for complete search history.

(56) References Cited

U.S. PATENT DOCUMENTS 6,569,671 B1 * 5/2003 Okamoto ............. B01J 19/0046
  359/618
10,177,872 B1 * 1/2019 Wang ................... G02B 6/4213
(Continued)

OTHER PUBLICATIONS

"Reliable Polarization Control of VCSELs Through Monolithically Integrated Surface Gratings: A Comparative Theoretical and Experimental Study" by Pierluigi Debernardi, Johannes Michael Ostermann, Martin Feneberg, Christof Jalics, and Rainer Michalzik, IEEE Journal of Selected Topics in Quantum Electronics, vol. 11, No. 1, Jan./Feb. 2005.

*Primary Examiner* — Edemio Navas, Jr.
(74) *Attorney, Agent, or Firm* — Pequignot + Myers; Matthew A. Pequignot

(57) ABSTRACT

An illuminator includes a semiconductor emitter chip, e.g. a VCSEL chip, configured for emitting a light beam. A polarization-selective element is optically coupled to the semiconductor emitter chip for defining a polarization state of the emitted light beam. A beam redirecting optic is coupled to the polarization-selective element for receiving and at least one of collimating or redirecting the emitted light beam. The polarization-selective element, e.g. a polarization-selective optical feedback element for VCSEL, defines a polarization state of the emitted light beam, thereby stabilizing output optical power of light beam propagated through the beam redirecting optic. A light beam of a constant optical power and a well-defined polarization state may be used as an illumination source for an eye-tracking system.

19 Claims, 10 Drawing Sheets

(51) Int. Cl.
*G02B 27/00* (2006.01)
*H01S 5/026* (2006.01)
*G01S 5/00* (2006.01)
*H04N 5/20* (2006.01)
*G06F 3/01* (2006.01)
*G02B 27/01* (2006.01)
*H04N 5/225* (2006.01)
*H01S 5/42* (2006.01)

(56) References Cited

U.S. PATENT DOCUMENTS

2014/0176958 A1* 6/2014 Flanders ............. H01S 5/02251
356/479
2020/0081252 A1* 3/2020 Jamali ................ G02B 27/0172

* cited by examiner

POLARIZATION-STABILIZED BEAM-SHAPING ILLUMINATOR

REFERENCE TO RELATED APPLICATION

The present application claims priority from U.S. Provisional Patent Application No. 62/934,420 filed on Nov. 12, 2019, entitled "Polarization-Stabilized Beam-Shaping Illuminator", and incorporated herein by reference in its entirety.

TECHNICAL FIELD

The present disclosure relates to light sources, and in particular to semiconductor light sources suitable for use in visual display and/or eye tracking systems.

BACKGROUND

Head mounted displays (HMD), helmet mounted displays, near-eye displays (NED), and the like are being used increasingly for displaying virtual reality (VR) content, augmented reality (AR) content, mixed reality (MR) content, etc. Such displays are finding applications in diverse fields including entertainment, education, training and biomedical science, to name just a few examples. The displayed VR/AR/MR content can be three-dimensional (3D) to enhance the experience and to match virtual objects to real objects observed by the user. Eye position and gaze direction, and/or orientation of the user may be tracked in real time using eye tracking devices, and the displayed imagery may be dynamically adjusted depending on the user's head orientation and gaze direction, to provide a better experience of immersion into a simulated or augmented environment.

Eye tracking devices may use illuminators that shine light, typically in an invisible part of the light spectrum, at the user's eyes. A video camera sensitive to the illuminating light may be employed to obtain a video stream of eye images. An on-board processor may determine the user's eye position and orientation by determining the position and orientation of cornea, eye pupil, etc., from these images. For example, an eye-tracking device may be used in a near-eye display and/or in a visual display system employing other types of displays, such as display panels, head-up displays, or in other applications, which do not involve a display system, such as an eye tracking system for biomedical research purposes. The illuminators used for eye tracking need to be small, efficient, and need to emit a well-defined light beam towards the user's eyes.

BRIEF DESCRIPTION OF THE DRAWINGS

Exemplary embodiments will now be described in conjunction with the drawings, in which.

DETAILED DESCRIPTION

Figure 1:
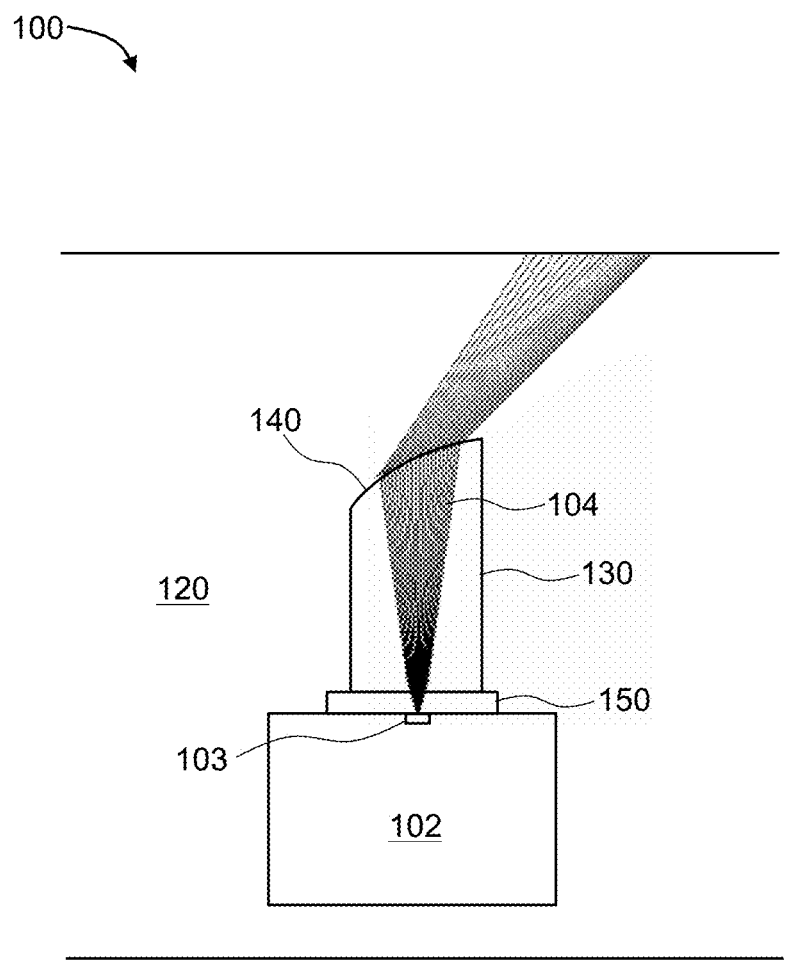
FIG. 1 is a schematic cross-sectional view of an illuminator of this disclosure.

While the present teachings are described in conjunction with various embodiments and examples, it is not intended that the present teachings be limited to such embodiments. On the contrary, the present teachings encompass various alternatives and equivalents, as will be appreciated by those of skill in the art.

All statements herein reciting principles, aspects, and embodiments of this disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

As used herein, the terms "first", "second", and so forth are not intended to imply sequential ordering, but rather are intended to distinguish one element from another, unless explicitly stated. Similarly, sequential ordering of method steps does not imply a sequential order of their execution, unless explicitly stated.

Eye illuminators used in eye tracking systems may be disposed around the eye to provide a uniform illumination of the eye. A dedicated camera may obtain images of the illuminated eye. An on-board processor may determine eye location and orientation by determining eye pupil locations on the obtained images. In some implementations, the determined eye pupil locations are compared with locations of reflections, termed "glints", in the eye images. The glints are formed when light beams emitted by the illuminators reflect from the eye's cornea and surrounding eye regions. The glints may be used as reference points in determining eye location and/or orientation. Due to their reference nature, the glints need to have substantially constant optical power levels. A steady over time and spatially uniform illumination of the eye is desired for eye tracking purposes.

Although many light sources are capable of operating at constant optical power levels, a state of polarization of the light sources may be undefined and/or fluctuating in time. By way of a non-limiting example, vertical cavity surface emitting lasers (VCSELs) often lack a steady state of polarization due to axial symmetry of VCSEL structure. The polarization fluctuation may be translated into optical power fluctuation when a light beam emitted by a VCSEL encounters an optical element having a polarization-dependent optical loss (PDL).

One such optical element may be a refractive beam redirecting optic coupled to the VCSEL for changing the direction of the emitted light beam to impinge onto an eyebox of a near-eye display. For example, a beam redirecting optic may include a prismatic element in the optical path of the emitted light beam. The prismatic element has a PDL due to Fresnel transmission and reflection coefficients being generally different for s- and p-polarization at oblique angles of incidence. Another source of polarization-dependent reflection may be the eye itself. When a light beam illuminates the eye at an oblique angle of incidence, the optical power level of a reflected light beam may depend upon a polarization state of the light beam due to different Fresnel reflection coefficients for s- and p-polarization of light.

In accordance with the present disclosure, an illuminator usable in an eye tracking system may include an semiconductor emitter chip and a beam redirecting optic coupled to the semiconductor emitter chip for receiving and at least one of collimating or redirecting the light beam. A polarization-selective element is provided for defining or stabilizing a polarization state of the emitted light beam. When the polarization state of the emitted light beam is stabilized, the signal power in the glints may remain constant at the constant emitted optical power level of the semiconductor emitter chip.

In accordance with the present disclosure, there is provided an illuminator comprising a semiconductor emitter chip for emitting a light beam, a polarization-selective element optically coupled to the semiconductor emitter chip for defining a polarization state of the light beam emitted thereby, and a beam redirecting optic coupled to the polarization-selective element for receiving and at least one of collimating or redirecting the light beam. In some embodiments, the polarization-selective element comprises a grating structure and/or a plurality of polarization-selective resonators. The polarization-selective element may have a spatial variation of at least one of thickness or refractive index. The spatial variation is in a lateral direction with respect to a direction of propagation of the light beam.

The illuminator may include a slab of transparent material. The semiconductor emitter chip and the beam redirecting optic may be supported by the slab, e.g. on the surface of the slab or immersed into the slab. By way of non-limiting examples, the beam redirecting optic includes at least one of: gallium phosphide, gallium arsenide, gallium nitride, indium phosphide, sapphire, or diamond. The semiconductor emitter chip may include at least one of: a vertical-cavity surface-emitting laser (VCSEL), a superluminescent light-emitting diode (SLED), a laser diode (LD), or a light-emitting diode (LED). The semiconductor emitter chip itself may emit unpolarized or randomly polarized light, i.e. may be configured to emit light of undefined polarization state, when the polarization-selective element is not present. The polarization-selective element may be configured to facilitate generation of laser light at one, well-defined polarization state such as linear polarization state, for example.

In some embodiments, the beam redirecting optic comprises at least one of a microlens or a tilted refractive surface, such that he light beam propagated through the beam redirecting optic propagates at a different angle than the light beam emitted by the semiconductor emitter chip. In embodiments where the semiconductor emitter chip comprises a vertical-cavity surface-emitting laser (VCSEL), the polarization-selective element may be implemented as a polarization-selective optical feedback element of the VCSEL.

More generally, the polarization-selective optical feedback element may be constructed in a variety of ways. For example, the polarization-selective optical feedback element may include a plurality of polarization-selective resonators, and/or may have a spatial variation of at least one of thickness or refractive index, where the spatial variation is in a lateral direction with respect to a direction of light propagation in the VCSEL. The polarization-selective optical feedback element may include a micro-structured metallization layer that reflects or absorbs light in a polarization-selective manner. In embodiments where the VCSEL comprises an epitaxially grown structure including an active layer between optical feedback layers, the polarization-selective optical feedback element may be a part of the epitaxially grown structure. By way of a non-limiting example, the polarization-selective optical feedback element may include a subwavelength grating at one of the optical feedback layers.

In accordance with the present disclosure, there is provided an eyebox illumination system comprising a substrate and a plurality of illuminators supported by the substrate. The substrate has a clear aperture for propagating light through the substrate and towards an eyebox. Each illuminator of the plurality of illuminators includes a semiconductor emitter chip for emitting a light beam; a polarization-selective element optically coupled to the semiconductor emitter chip for defining a polarization state of the light beam emitted by the semiconductor emitter chip; and a beam redirecting optic coupled to the semiconductor emitter chip for receiving and at least one of collimating or redirecting the light beam.

In some embodiments, the semiconductor emitter chips and the beam redirecting optics of the plurality of illuminators are immersed into the substrate and are oriented to emit corresponding light beams towards the eyebox. The semiconductor emitter chip may be configured to emit light of undefined polarization state in absence of the polarization-selective element. The semiconductor emitter chips of the plurality of illuminators may be oriented in a same direction, and the beam redirecting optics of the plurality if illuminators may be configured to redirect corresponding light beams at different angles to propagate towards the eyebox. In embodiments where the semiconductor emitter chip comprises a vertical-cavity surface-emitting laser (VCSEL), the polarization-selective element may include a polarization-selective optical feedback element of the VCSEL.

In accordance with the present disclosure, there is further provided an eye-tracking system comprising the eyebox illumination system described above and an eye-tracking camera disposed and configured to obtain an image of a user's eye when the user's eye is placed into the eyebox and illuminated by the eyebox illumination system.

Referring to FIG. 1, an illuminator 100 includes a semiconductor emitter chip 102 configured for emitting a light beam 104 and a beam redirecting optic 130 for collimating and/or redirecting the light beam 104. In the embodiment shown, the beam redirecting/collimating optic 130 includes a tilted and curved optical surface 140, which collimates and redirects the light beam 104. The optical surface 140 may modify the direction of propagation of the light beam 104, i.e. it may cause the light beam 104 to have a different angle of propagation downstream of the optical surface 140 as compared to the angle of propagation upstream of the optical surface 140. In other words, a ray angle of a chief ray of the light beam 104 may change upon propagating through the beam redirecting/collimating optic 130. A refractive index of the beam redirecting/collimating optic 130 may differ from a refractive index of the semiconductor emitter chip 102 by at least 0.1, e.g. 0.2, 0.5, or greater. The beam redirecting/collimating optic 130 may include a refractive surface, a reflective surface, and/or a diffractive surface configured to steer a direction of a main lobe of emission of a semiconductor light source. The optical surface 140 may be a freeform optical surface, and may have no axial symmetry. The aperture of the optical surface 140 may be circular or non-circular.

The semiconductor emitter chip 102 may have an emitting region 103 confined to a small size, e.g. smaller than 300×300 micrometers. The confinement of the emitting region 103 may be achieved by etching, electrical confinement, and/or optical confinement. By way of non-limiting examples, the semiconductor emitter chip 102 may be e.g. at least one of: a VCSEL, a vertical external cavity surface-emitting laser (VECSEL), a light emitting diode (LED), a superluminescent LED (SLED), or a laser diode (LD). For brevity, the term VCSEL includes a VECSEL throughout this disclosure.

The semiconductor emitter chip 102 itself may be relatively small, e.g. it may have outer dimensions of less than 300×300 micrometers. The semiconductor emitter chip 102 may emit light in the range of wavelength of between 400 nm and 1600 nm, for example. The emission cone of the semiconductor emitter chip 102 may be less than 140 degrees full angle, for example. The light beam 104 may be emitted through an aperture located on one of the surfaces of the semiconductor emitter chip 102. There may be more than one aperture. The active area of the semiconductor emitter chip may include quantum wells, quantum dots, 2D engineered materials, or any other material having an optically active energy transition, i.e. energy transition which is accompanied by emitting or absorbing a photon.

A polarization-selective element 150 may be disposed in an optical path between the semiconductor emitter chip 102 and the beam redirecting/collimating optic 130 for defining and/or stabilizing a polarization state of the light beam 104 emitted by the semiconductor emitter chip 102. The polarization-selective element 150 may be integrally formed on or within the semiconductor emitter chip 102. The polarization-selective element 150 may also be external to the semiconductor emitter chip 102. In some embodiments, the polarization-selective element 150 may be a polarization-selective optical feedback element of a laser source. Embodiments of the polarization-selective element 150 will be considered further below.

In some embodiments, the illuminator 100 may further include a slab 120 of transparent material. The semiconductor emitter chip 102 and the redirecting/collimating optic 130 may be immersed into the slab 120. The slab 120 may define and maintain a relative position and orientation of the semiconductor emitter chip 102 and the redirecting/collimating optic 130. To provide refractive optical power and/or the redirecting capability, the beam redirecting/collimating optic 130 may be made of an optical material having a refractive index different from the refractive index of the slab 120 and/or the semiconductor emitter chip 102. The difference of the refractive index of the slab 120 and the beam redirecting/collimating optic 130 may be e.g. at least 0.1; at least 0.2; or at least 0.5. By way of non-limiting examples, the beam redirecting/collimating optic 130 may be made e.g. of gallium phosphide, gallium arsenide, gallium nitride, indium phosphide, sapphire, or diamond. In some embodiments, less then 50% of the light emitted by the semiconductor emitter chip 102 may be totally internally reflected (TIR'd) by the slab 120. For instance, less than 40%, 30%, 20%, or 10% of the optical power of the light beam 104 may be TIR'd. In other words, the slab 120 may be configured to reduce the abrupt refractive index step, thereby reducing the portion of TIR'd light.

Figure 2A:
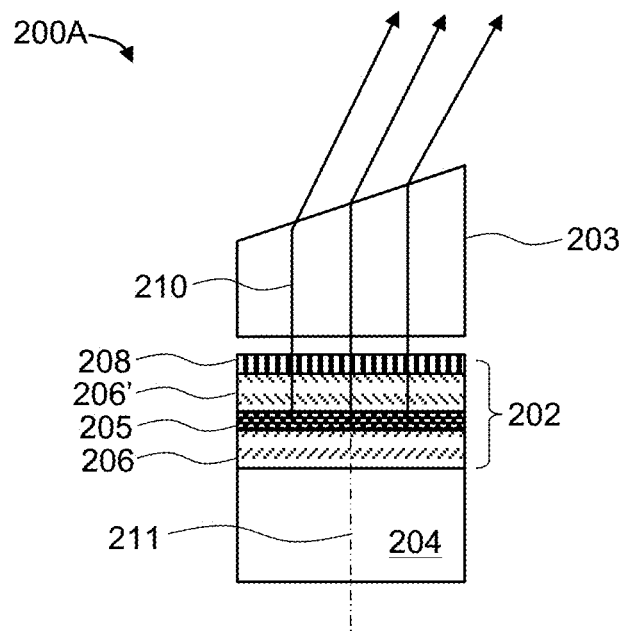
FIG. 2A is a schematic cross-sectional view of an illuminator including a vertical cavity surface emitting laser (VCSEL) coupled to a beam redirecting optic.

Referring to FIG. 2A, an illuminator 200A includes an epitaxially grown VCSEL structure 202 optically coupled to a beam redirecting optic 203. The VCSEL structure 202 is grown on a substrate 204. The VCSEL structure 202 includes an active layer 205 disposed between optical feedback layers 206, 206'. The active layer 205 may be, for example, a p-n junction of a semiconductor diode. Quantum wells (QW) may be disposed at the p-n junction. The optical feedback layers 206, 206' may include distributed Bragg reflectors (DBR) for selective reflection of light 210 at corresponding Bragg wavelengths, for defining an emission wavelength, or a band of emission wavelength, of the VCSEL structure 202. The optical feedback layers 206, 206' and the active layer 205 are supported by the substrate 204.

A polarization-selective optical feedback element 208 may extend from the upper optical feedback layer 206' of the epitaxially grown VCSEL structure 202, as shown in FIG. 2A. The function of the polarization-selective optical feedback element 208 is to provide a polarization-selective optical parameter, such as a reflection and/or a transmission coefficient, depending on configuration. Without the polarization-selective optical feedback element 208, the VCSEL structure 202 would be symmetrical about a vertical axis 211. Due to the symmetry of the VCSEL structure 202, emitted light 210 may have an undefined, randomly fluctuating polarization state in absence of the polarization-selective optical feedback element 208. The polarization-dependent reflection coefficient of the polarization-selective optical feedback element 208 provides a more favorable condition for a polarization mode with a higher coefficient of reflection to get amplified in the VCSEL structure 202, thereby depleting the optical gain for the mode with a lower reflection coefficient and stabilizing the overall polarization state of the emitted light 210.

The polarization-selective optical feedback element 208 may be implemented in a number of ways. In some embodiments, the polarization-selective optical feedback element 208 has a spatial variation of at least one of thickness or refractive index in a lateral direction with respect to a direction of propagation of the light 210 in the VCSEL structure 202, i.e. perpendicular to the axis 211, to provide the polarization selectivity. For example, the polarization-selective optical feedback element 208 may include a sub-wavelength grating structure having fringes of a different refractive index and/or absorption coefficient than the underlying substrate. Light having linear polarization along the lines of the sub-wavelength grating structure may undergo stronger reflection than light having an orthogonal linear polarization. Through the polarization mode competition, the lazing mode will have the linear polarization oriented along the lines of the sub-wavelength grating structure.

The beam redirecting optic 203 may include a tilted refractive surface, e.g. prismatic structure for redirecting the light 210 towards a target such as an eyebox. Herein, an eyebox means a 2D area where the user's eyes are located relative to the illumination system and/or an eye tracking system during normal operation. The beam redirecting optic 203 may also include a microlens for collimating and/or re-focusing the light 210. The microlens may be spherical, aspheric, freeform, conical, pyramidal, etc. The microlens may be refractive, diffractive, or both. In some embodiments, the beam redirecting optic 203 may include an integrated redirecting and collimating element, such as a prismatic element with a curved output surface, similar to the curved optical surface 140 of the illuminator 100 of FIG. 1, or a diffractive element, such as a grating, a metastructure, a holographic element, a polarization volume hologram or grating, etc. One or more facets of the beam redirecting optic 203 may have a dielectric or metallic coating to reflect the light 210 towards another facet of the beam redirecting optic 203. One or more facets of the beam redirecting optic 203 may also be configured for total internal reflection of the light 210. Furthermore, one or more of the facets of the beam redirecting optic 203 may have an antireflective (AR) coating to reduce reflection of light from that particular facet. Although shown in FIG. 2A as separate elements, the beam redirecting optic 203 may extend from the VCSEL structure 202, e.g. from the polarization-selective element 208.

The beam redirecting optic 203 may be manufactured e.g. by using a reflow process. The polarization-selective optical feedback element 208 may be patterned into the VCSEL structure 202. In some embodiments, a slab of transparent material, e.g. sapphire or silicon carbide, may be bonded to the VCSEL structure 202. The beam redirecting optic may be formed in the slab using lithography. Alternatively, the beam redirecting optic 203 may be fixed apart from the VCSEL structure 202 e.g. by immersing the VCSEL structure 202 and the beam redirecting optic 203 into a transparent host material, similar to the illuminator 100 of FIG. 1.

Figure 2B:
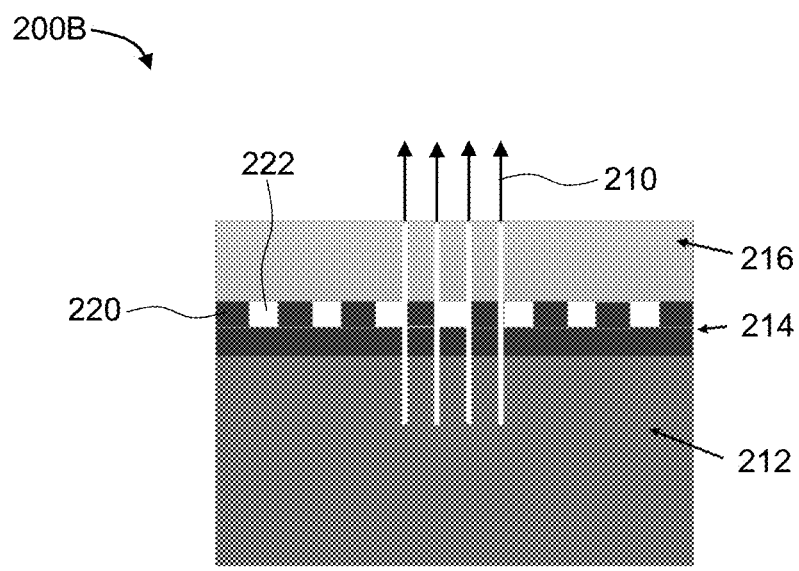
FIG. 2B is a schematic cross-sectional view of an illuminator embodiment including a grating-based polarization selective element.

Turning to FIG. 2B, an illuminator 200B includes a semiconductor emitter chip 212, a polarization-selective subwavelength grating 214 extending from the semiconductor emitter chip 212, and a beam redirecting optic 216 extending from the polarization-selective subwavelength grating 214. The polarization is controlled by a polarization-selective reflection of the emitted light 210 from the subwavelength grating 214, which may be formed on a separate wafer and wafer-bonded to the semiconductor emitter chip 212, or may be a part of the epitaxially grown structure of the semiconductor emitter chip 212. In the embodiment shown, the polarization-selective subwavelength grating 214 is supported by the semiconductor emitter chip 212, and the beam redirecting optic 216 is supported by the polarization-selective subwavelength grating 214. A stack of several layers may be formed, including the emitter epitaxial structure, polarization control elements, and/or beam collimation and redirection elements. The polarization and light redirection elements may be formed at interfaces between different layers in a successive fashion. The polarization-selective subwavelength grating 214 may include a plurality of lines or fringes 220 separated by gaps 222, which may be filled with a material having different refractive index, reflection, and/or absorption coefficient than the fringes 220. The fringes 220 may be formed lithographically, e.g. by photolithography, nanoimprint lithography, etc. The beam redirecting optic 216 may be refractive, reflective, diffractive, and in some embodiments may include a gradient index material.

Figure 3:
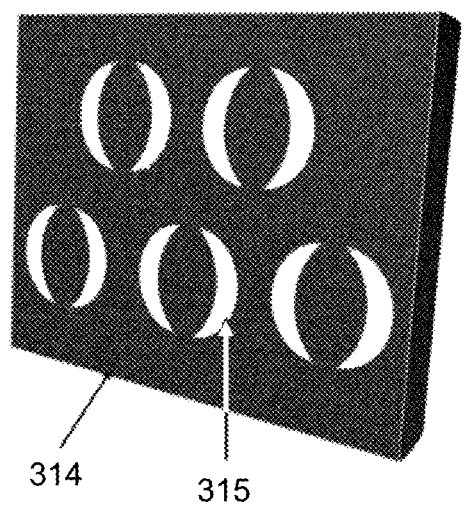
FIG. 3 is a three-dimensional view of a plurality of polarization-selective resonators usable as the polarization-selective element of the illuminator of FIG. 1 and FIG. 2A.

Referring now to FIG. 3, a resonant polarization-selective optical element 314 may include a plurality of polarization-selective resonators 315, e.g. metal, dielectric, semiconductor, or metal-dielectric, metal-semiconductor, metal-semiconductor-dielectric, etc. micro- or nano-structured layers having a polarization-selective plasmonic resonance at optical frequencies. The micro- or nano-structured layers may include micro- or nano-structured metallization layers, in which arrays of microscopic or nanoscopic shapes have been formed or patterned. The arrays of microscopic or nanoscopic shapes may be configured to have plasmonic resonances in wavelength band(s) of interest. Due to polarization-selective resonance property, impinging light of one polarization is reflected or absorbed stronger than light of another, orthogonal polarization, i.e. in a polarization-selective manner. The propagation mode gain competition results in only one mode, specifically one corresponding to a higher reflectivity or lower absorption, being the lasing mode of the semiconductor emitter. The polarization-selective resonators 315 may have shapes of straight or curved rods, circles, doughnuts, prolate or oblate ellipsoids, etc., and may be disposed in ordered arrays, e.g. rectangular arrays, hexagonal arrays, etc. The shapes may also be grouped or paired, as shown in FIG. 3.

Figure 4:
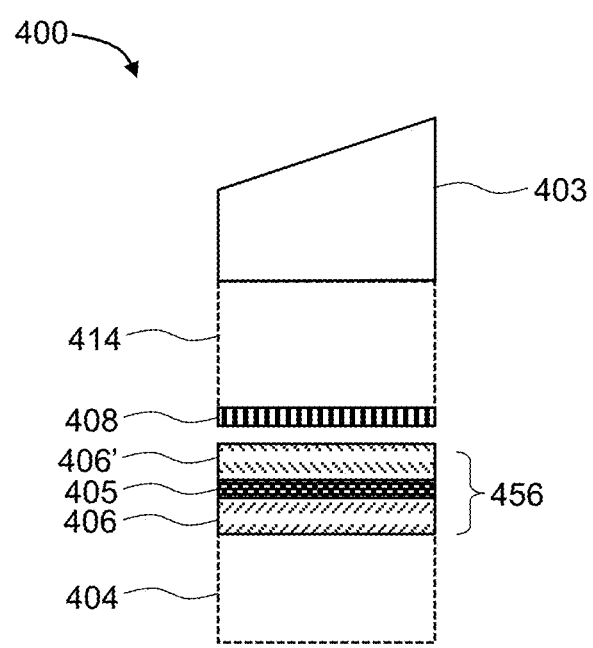
FIG. 4 is a schematic cross-sectional view of an illuminator embodiment including a semiconductor emitter chip and a polarization-selective element on separate substrates.

Referring to FIG. 4, an illuminator 400 includes an emitter epitaxial structure 456 supported by a first substrate 404, and a polarization-selective element 408 supported by a second substrate 414. A beam redirecting optic 403 may be provided on an opposite side of the second substrate 414, or may be formed in the second substrate 414. The emitter epitaxial structure 456 may include an active layer 405, e.g. a p-n junction hosting a multiple quantum well (MQW) layer, quantum dots layer, or any other active layer. The active layer 405 is sandwiched between distributed Bragg reflectors 406, 406'. In operation, the polarization-selective element 408 provides at least a portion of optical feedback for the active layer 405, thereby favoring one polarization lasing mode over the other. As a result of mode competition for the optical gain, the favored polarization mode will become the lasing mode. The epitaxial structure 456 and the polarization-selective element 408 may be bonded together using suitable wafer bonding techniques, or may be supported by a transparent host material or matrix. In some embodiments, the first substrate 404 may carry an array of the emitter epitaxial structures 456, and the second substrate 414 may carry an array of the polarization-selective elements 408 on one side and the beam redirecting optics 403 on the other. The substrates 404 and 414 may be aligned to each other and joined together, thereby forming an array of the illuminators 400.

Figure 5A:
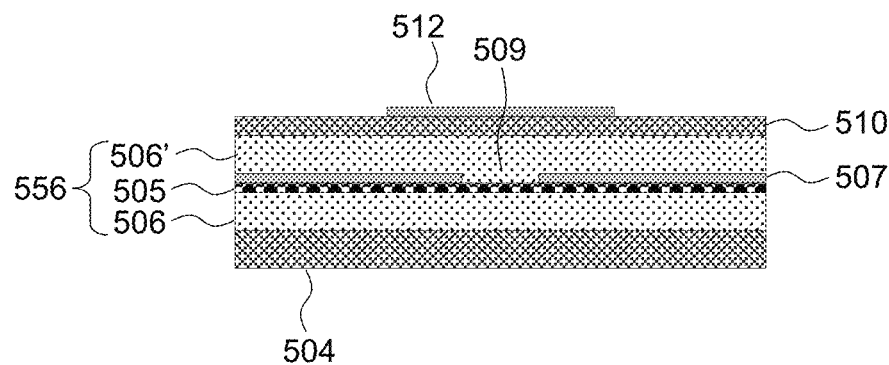
FIGS. 5A to 5F are side cross-sectional views of an illuminator of this disclosure, the illuminator including a monolithically formed polarization-selective element and a beam-focusing optic on a VCSEL at different stages of manufacture.

FIGS. 5A to 5F illustrate an example fabrication process of a AlGaAs VCSEL including a polarization-selective element 508 over a semiconductor emitter structure 556, and a high refractive index prismatic focusing element 503 (FIG. 5E) on top of the polarization-selective element 508. In this example process, the high index material is an AlGaAs alloy. Referring to FIG. 5A, an n-type distributed Bragg reflector (n-DBR) $Al_xGa_{1-x}As$ layer 506 is epitaxially grown on an n-GaAs substrate 504. A quantum well (QW) layer 505 is grown on the n-DBR layer 506. An intermediate oxide layer 507 is formed on the QW layer 505. An opening 509 is formed in the intermediate oxide layer 507 for containing the flow of electric carriers through the opening 509. A p-type distributed Bragg reflector (p-DBR) $Al_xGa_{1-x}As$ layer 506' is then formed on the oxide layer 507, filling the opening 509. A p-GaAs contact layer 510 may then be formed. A passivation oxide layer 512 may be formed on the p-GaAs contact layer 510.

Figure 5B:
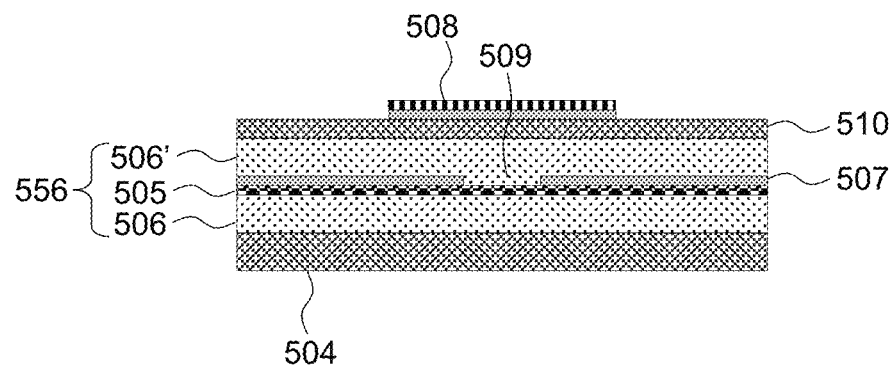
Figure 5C:
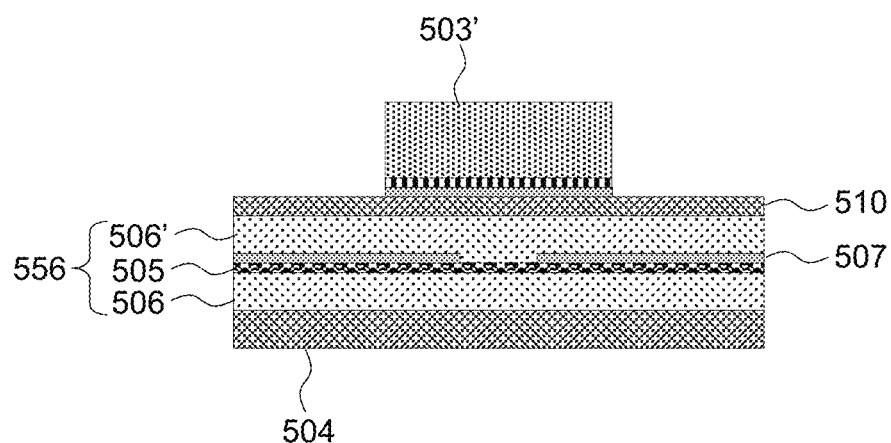
Figure 5D:
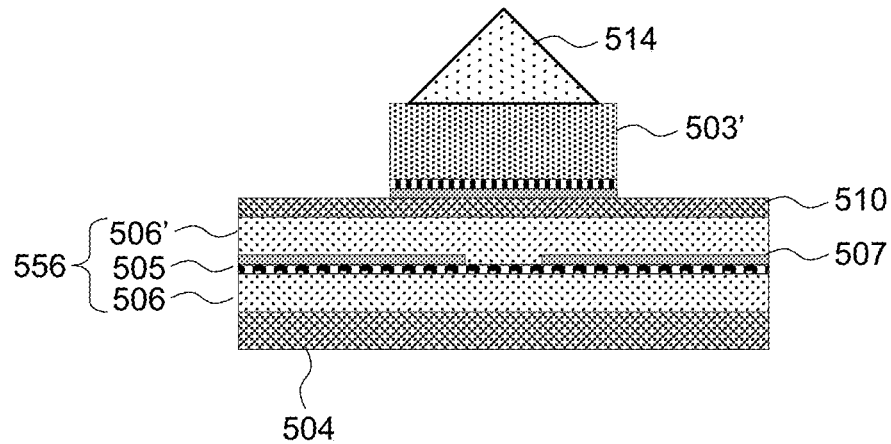

Referring to FIG. 5B, the polarization-selective element 508, e.g. a subwavelength grating and/or a polarization-selective resonator described above with reference to FIGS. 2B and 3 respectively, may be formed on top of the semiconductor emitter structure 556 by nanolithography or another suitable method. An $Al_xGa_{1-x}As$ lens blank 503' may then be formed (FIG. 5C) on the polarization-selective element 508, e.g. by employing chemical vapor deposition (CVD). A photoresist sacrificial shape 514 is formed on the lens blank 503' (FIG. 5D) e.g. by spin-coating, and shaped to a desired three-dimensional profile using a suitable photolithography method.

Figure 5E:
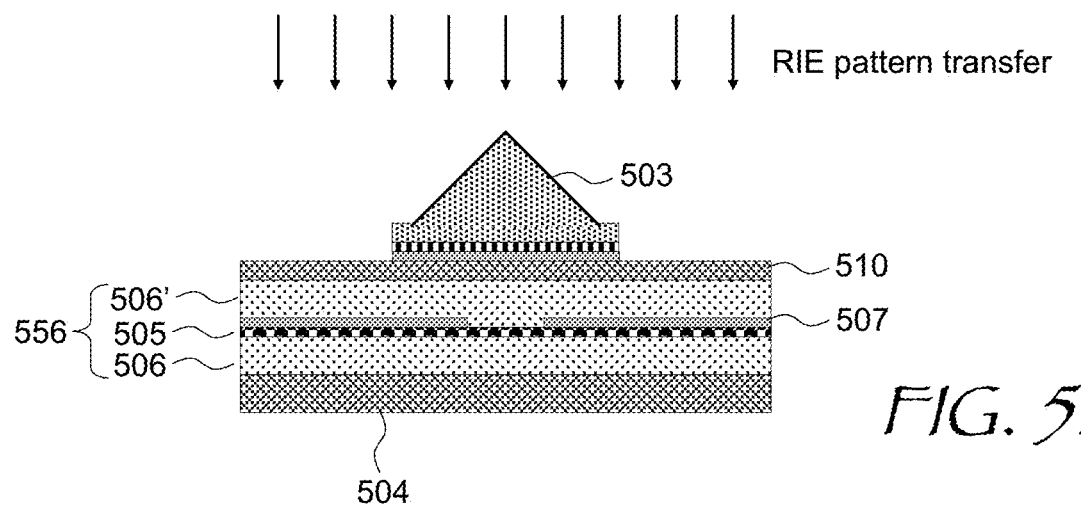
Figure 5F:
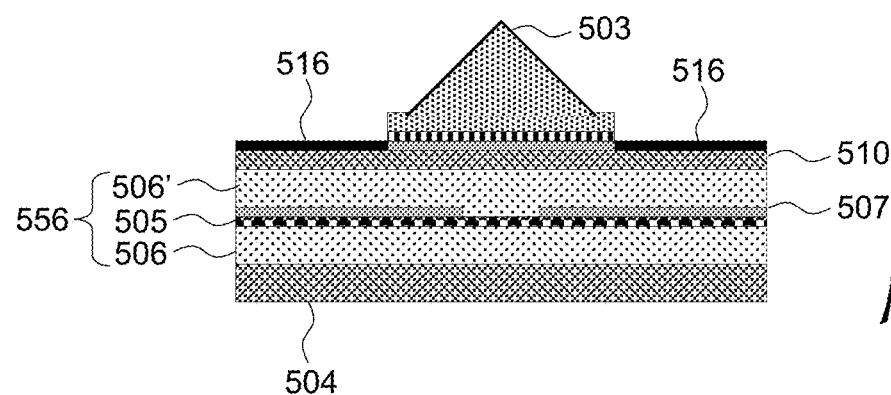

Turning to FIG. 5E, the reactive ion etching (RIE) may be applied to the top surface of the chip including the photoresist sacrificial shape 514, thereby effectively transferring the shape into the InGaAs lens blank 503' and forming a focusing element 503. A metallization layer may then be deposited (FIG. 5F) on sides of the focusing element 503 to form bond pads 516.

Figure 6A:
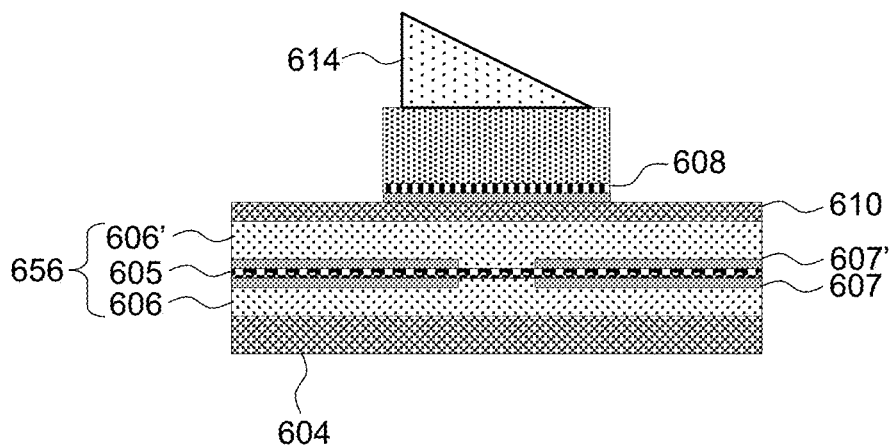
FIGS. 6A and 6B are side cross-sectional views of an illuminator of this disclosure including a monolithically formed polarization-selective element and a beam-redirecting optic on a VCSEL at different stages of manufacture.
Figure 6B:
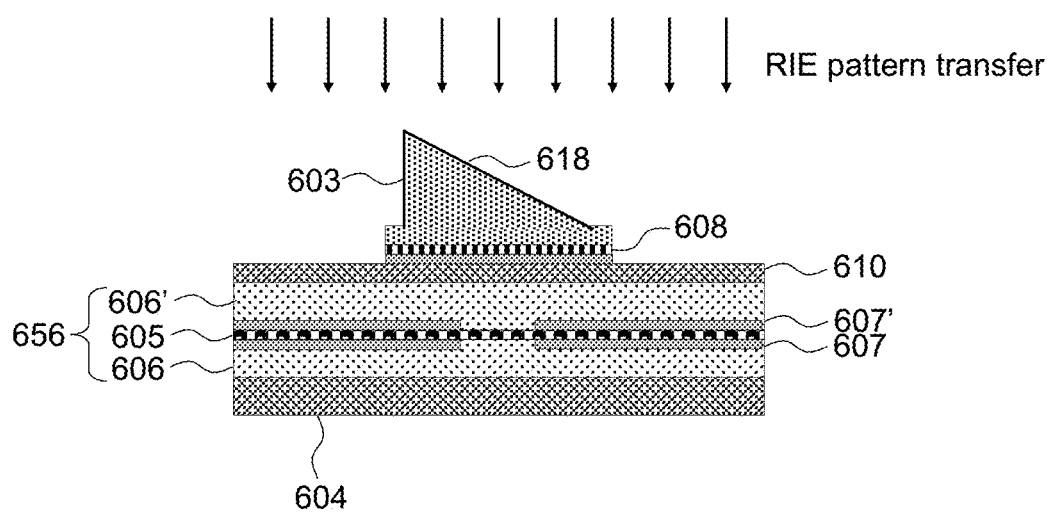

The process described above may be modified to form other optical elements, as well. By way of a non-limiting example, FIGS. 6A and 6B illustrate the process of manufacturing an AlGaAs prism 603 with a tilted exit optical surface 618 formed over a polarization-selective element 608. The chip structure is similar to that of FIGS. 5A to 5E. An emitter epitaxial structure 656 is supported by a substrate 604. The emitter epitaxial structure 656 includes a QW layer 605 between n-DBR 606 and p-DBR 606' layer, and not one but two intermediate oxide layers 607, 607' on opposing sides of the QW layer 605, for better confinement of carriers to the light-emitting region. A p-GaAs contact layer 610 is formed on the emitter epitaxial structure 656. Curvature of the exit optical surface 618 may be achieved using suitable resist patterns and etching processes. For example, a resist element 614 may be formed with a curved surface. The curved surface may then be transferred into the surface of the AlGaAs prism 603 using e.g. a dry-etching or another suitable technique.

Figure 7:
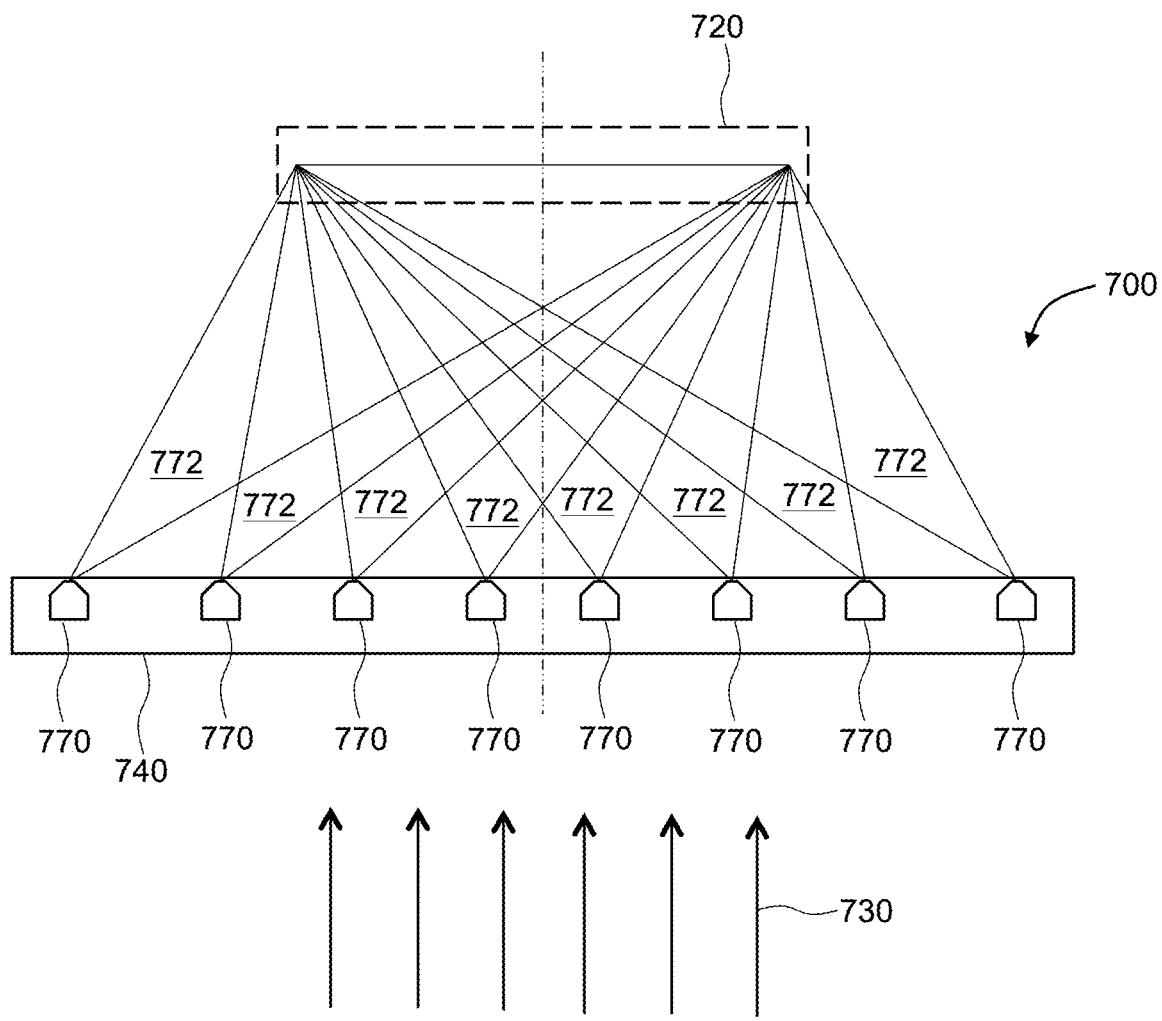
FIG. 7 is a side cross-sectional view of an eyebox illumination system including illuminators disclosed herein.

Turning now to FIG. 7, an eyebox illumination system 700 may be used to illuminate an eyebox 720, to provide glints for eye-tracking purposes as explained above. The eyebox illumination system 700 includes a substrate 740 having a clear aperture for propagating external light 730 towards the eyebox 720, enabling a user, whose eyes are illuminated by the eyebox illumination system 700, to see outside world and/or an image displayed by a near-eye display through the substrate 740.

The eyebox illumination system 700 further includes a plurality of illuminators 770 immersed into the substrate 740. At least two illuminators 770 may be provided. Any of the illuminators disclosed herein, e.g. the illuminator 100 of FIG. 1, the illuminator 200A of FIG. 2A, the illuminator 200B of FIG. 2B, the illuminator 400 of FIG. 4, and the semiconductor structures of FIGS. 5A to 5F and 6A, 6B, may be used as the illuminators 770 of FIG. 7. The semiconductor emitter chips and the beam redirecting optics of the illuminators 770 may be supported by the substrate 740 on its surface and/or within the surface, i.e. may be immersed into the substrate 740, and may be oriented to emit light beams 772 towards the eyebox 720. In some embodiments, the semiconductor emitter chips of the plurality of illuminators 770 are oriented in a same direction, and the beam redirecting optics of the plurality if illuminators 770 are configured to redirect corresponding light beams at different angles to propagate towards the eyebox 720.

The light beams 772 may be redirected, focused, and/or collimated to illuminate the eyebox 720 in an approximately uniform manner, such that wherever a user's eye is in the eyebox 720, the user's eye may be illuminated by every one, or most of the illuminators 770. Alternatively, at least some illuminators 770 may be configured to illuminate dedicated portions of the eyebox 720. The beam redirecting optics of the illuminators 770 may be configured accordingly to redirect and/or reshape the emitted light beams 772. Herein, the term "redirect" means that a chief ray of the emitted light beam changes the beam angle upon propagation through the redirecting element. Thus, the beam redirecting optics of the illuminators 770 may redirect the emitted light beams at different angles, and may also provide light beams of differing divergence. The illuminators 770, or any other illuminators of this disclosure for that matter, may emit light in an invisible part of the spectrum. By way of a non-limiting example, the illuminators considered herein may emit near-infrared light at wavelengths between 780 and 1100 nm. Such light does not distract or blind the user, while being detectable by silicon photodetectors.

Figure 8:
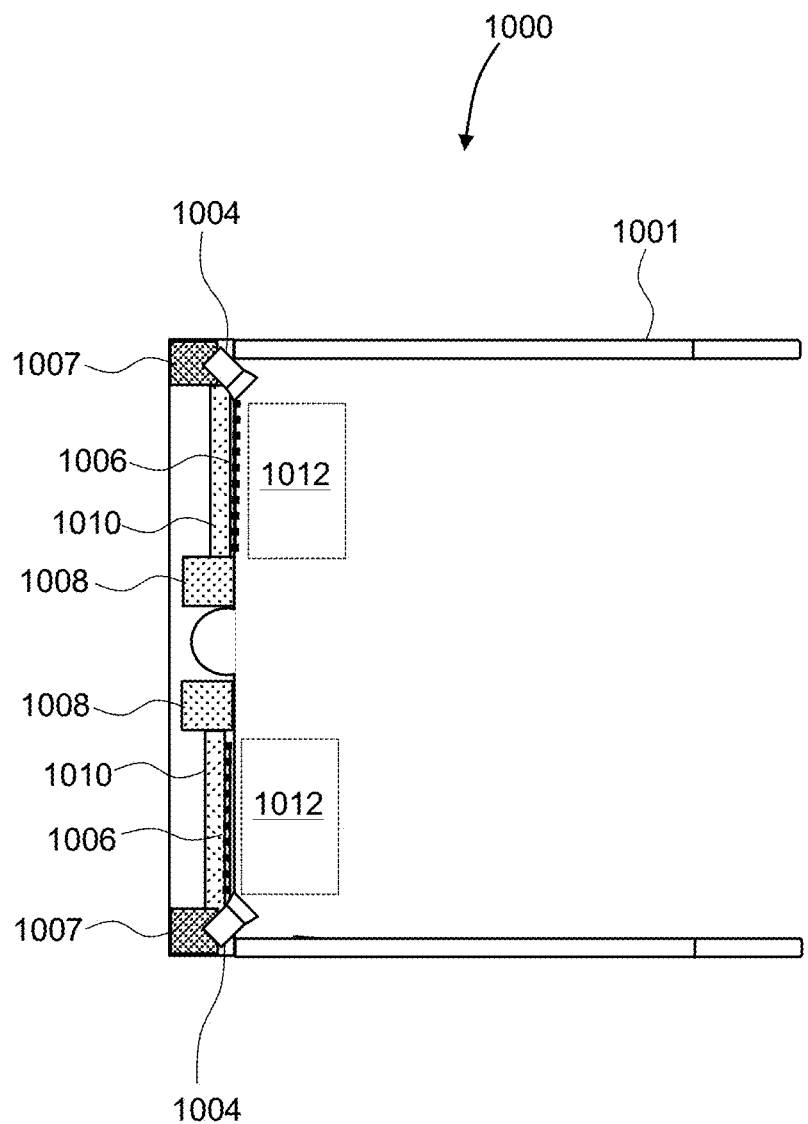
FIG. 8 is a top cross-sectional view of a near-eye display (NED) including the eyebox illumination system of FIG. 7.

Turning to FIG. 8, a near-eye display 1000 includes a frame 1001 having a form factor of a pair of eyeglasses. The frame 1001 supports, for each eye: a projector 1008, a pupil-replicating waveguide 1010 optically coupled to the projector 1008, an eye-tracking camera 1004, a plurality of illuminators 1006, and an eye-tracking camera controller 1007. The illuminators 1006 may be supported by the pupil-replicating waveguide 1010 for illuminating an eyebox 1012. The projector 1008 provides a fan of light beams carrying an image in angular domain to be projected into a user's eye. The pupil-replicating waveguide 1010 receives the fan of light beams and provides multiple laterally offset parallel copies of each beam of the fan of light beams, thereby extending the projected image over the eyebox 1012. The eyebox 1012 is a geometrical area where an image of acceptable quality is formed for observation by the eye of a user. In some embodiments, the pupil-replicating waveguide 1010 is made transparent or translucent to enable the user to view the outside world together with the images projected into each eye and superimposed with the outside world view. The images projected into each eye may include objects disposed with a simulated parallax, so as to appear immersed into the real world view.

The purpose of the eye-tracking cameras 1004 is to determine position and/or orientation of both eyes of the user. Once the position and orientation of the user's eyes are known, a gaze convergence distance and direction may be determined. The imagery displayed by the projectors 1008 may be adjusted dynamically to account for the user's gaze, for a better fidelity of immersion of the user into the displayed augmented reality scenery, and/or to provide specific functions of interaction with the augmented reality.

The illuminators 1006 may be supported by the pupil-replicating waveguides 1010 directly. In some embodiments, the illuminators 1006 are immersed into a substrate, as explained above with reference to the eyebox illumination system 700 of FIG. 7. The substrate may be mounted to the corresponding pupil-replicating waveguide 1010; in some embodiments, the pupil-replicating waveguide 1010 may support the illuminators 1006 directly. The illuminators 1006 may be disposed on the periphery of the pupil-replicating waveguide 1010 so as not to impede the outside world view, or within the field of view, in an inconspicuous manner. The eyebox illumination system including the substrate and the illuminators 1006 and the eye-tracking camera 1004 together form an eye-tracking system.

In operation, the illuminators 1006 illuminate the eyes at the corresponding eyeboxes 1012, to enable the eye-tracking cameras to obtain the images of the eyes, as well as to provide reference reflections i.e. glints. The glints may function as reference points in the captured eye image, facilitating the eye gazing direction determination by determining position of the eye pupil images relative to the glints images. To avoid distracting the user with illuminating light, the latter may be made invisible to the user. For example, infrared light may be used to illuminate the eyeboxes.

The function of the eye-tracking camera controllers 1007 is to process images obtained by the eye-tracking cameras 1004 to determine, in real time, the eye gazing directions of both eyes of the user. In some embodiments, the image processing and eye position/orientation determination functions may be performed by a central controller, not shown, of the near-eye display 1000. The central controller may also provide control signals to the projectors 1008 to generate the images to be displayed to the user, depending on the determined eye positions, eye orientations, gaze directions, eyes vergence, etc.

Embodiments of the present disclosure may include, or be implemented in conjunction with, an artificial reality system. An artificial reality system adjusts sensory information about outside world obtained through the senses such as visual information, audio, touch (somatosensation) information, acceleration, balance, etc., in some manner before presentation to a user. By way of non-limiting examples, artificial reality may include virtual reality (VR), augmented reality (AR), mixed reality (MR), hybrid reality, or some combination and/or derivatives thereof. Artificial reality content may include entirely generated content or generated content combined with captured (e.g., real-world) content. The artificial reality content may include video, audio, somatic or haptic feedback, or some combination thereof. Any of this content may be presented in a single channel or in multiple channels, such as in a stereo video that produces a three-dimensional effect to the viewer. Furthermore, in some embodiments, artificial reality may also be associated with applications, products, accessories, services, or some combination thereof, that are used to, for example, create content in artificial reality and/or are otherwise used in (e.g., perform activities in) artificial reality. The artificial reality system that provides the artificial reality content may be implemented on various platforms, including a wearable display such as an HMD connected to a host computer system, a standalone HMD, a near-eye display having a form factor of eyeglasses, a mobile device or computing system, or any other hardware platform capable of providing artificial reality content to one or more viewers.

Figure 9A:
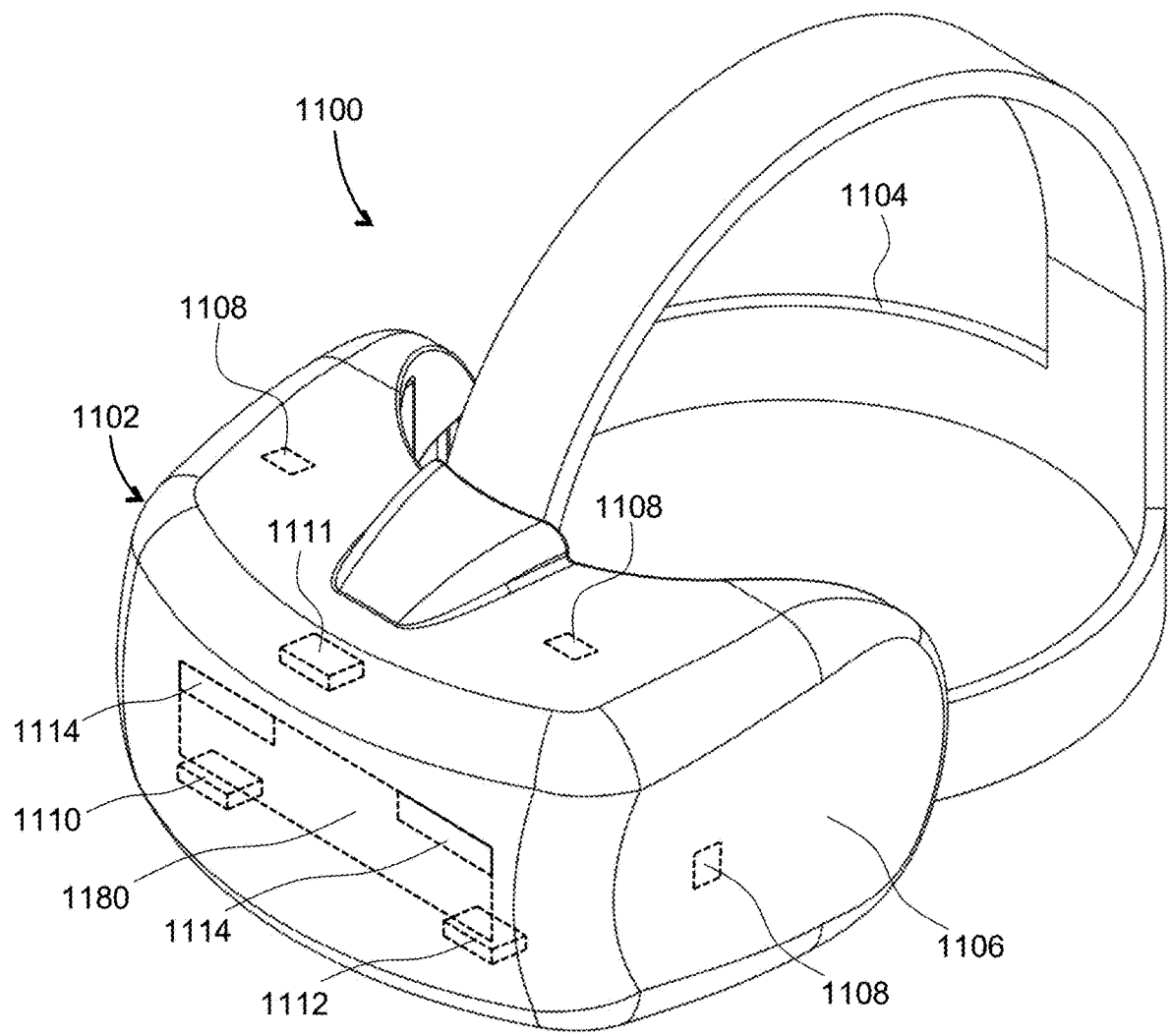
FIG. 9A is an isometric view of a head-mounted display of the present disclosure.

Referring to FIG. 9A, an HMD 1100 is an example of an AR/VR wearable display system which encloses the user's face, for a greater degree of immersion into the AR/VR environment. The HMD 1100 is an embodiment of the near-eye display 1000 of FIG. 8, for example. The function of the HMD 1100 is to augment views of a physical, real-world environment with computer-generated imagery, and/or to generate the entirely virtual 3D imagery. The HMD 1100 may include a front body 1102 and a band 1104. The front body 1102 is configured for placement in front of eyes of a user in a reliable and comfortable manner, and the band 1104 may be stretched to secure the front body 1102 on the user's head. A display system 1180 may be disposed in the front body 1102 for presenting AR/VR imagery to the user. Sides 1106 of the front body 1102 may be opaque or transparent.

In some embodiments, the front body 1102 includes locators 1108 and an inertial measurement unit (IMU) 1110 for tracking acceleration of the HMD 1100, and position sensors 1112 for tracking position of the HMD 1100. The IMU 1110 is an electronic device that generates data indicating a position of the HMD 1100 based on measurement signals received from one or more position sensors 1112, which generate one or more measurement signals in response to motion of the HMD 1100. Examples of position sensors 1112 include: one or more accelerometers, one or more gyroscopes, one or more magnetometers, another suitable type of sensor that detects motion, a type of sensor used for error correction of the IMU 1110, or some combination thereof. The position sensors 1112 may be located external to the IMU 1110, internal to the IMU 1110, or some combination thereof.

The locators 1108 are traced by an external imaging device of a virtual reality system, such that the virtual reality system can track the location and orientation of the entire HMD 1100. Information generated by the IMU 1110 and the position sensors 1112 may be compared with the position and orientation obtained by tracking the locators 1108, for improved tracking accuracy of position and orientation of the HMD 1100. Accurate position and orientation is important for presenting appropriate virtual scenery to the user as the latter moves and turns in 3D space.

The HMD 1100 may further include a depth camera assembly (DCA) 1111, which captures data describing depth information of a local area surrounding some or all of the HMD 1100. To that end, the DCA 1111 may include a laser radar (LIDAR), or a similar device. The depth information may be compared with the information from the IMU 1110, for better accuracy of determination of position and orientation of the HMD 1100 in 3D space.

The HMD 1100 may further include an eye tracking system 1114 for determining orientation and position of user's eyes in real time. The obtained position and orientation of the eyes also allows the HMD 1100 to determine the gaze direction of the user and to adjust the image generated by the display system 1180 accordingly. In one embodiment, the vergence, that is, the convergence angle of the user's eyes gaze, is determined. The determined gaze direction and vergence angle may also be used for real-time compensation of visual artifacts dependent on the angle of view and eye position. Furthermore, the determined vergence and gaze angles may be used for interaction with the user, highlighting objects, bringing objects to the foreground, creating additional objects or pointers, etc. An audio system may also be provided including e.g. a set of small speakers built into the front body 1102.

Figure 9B:
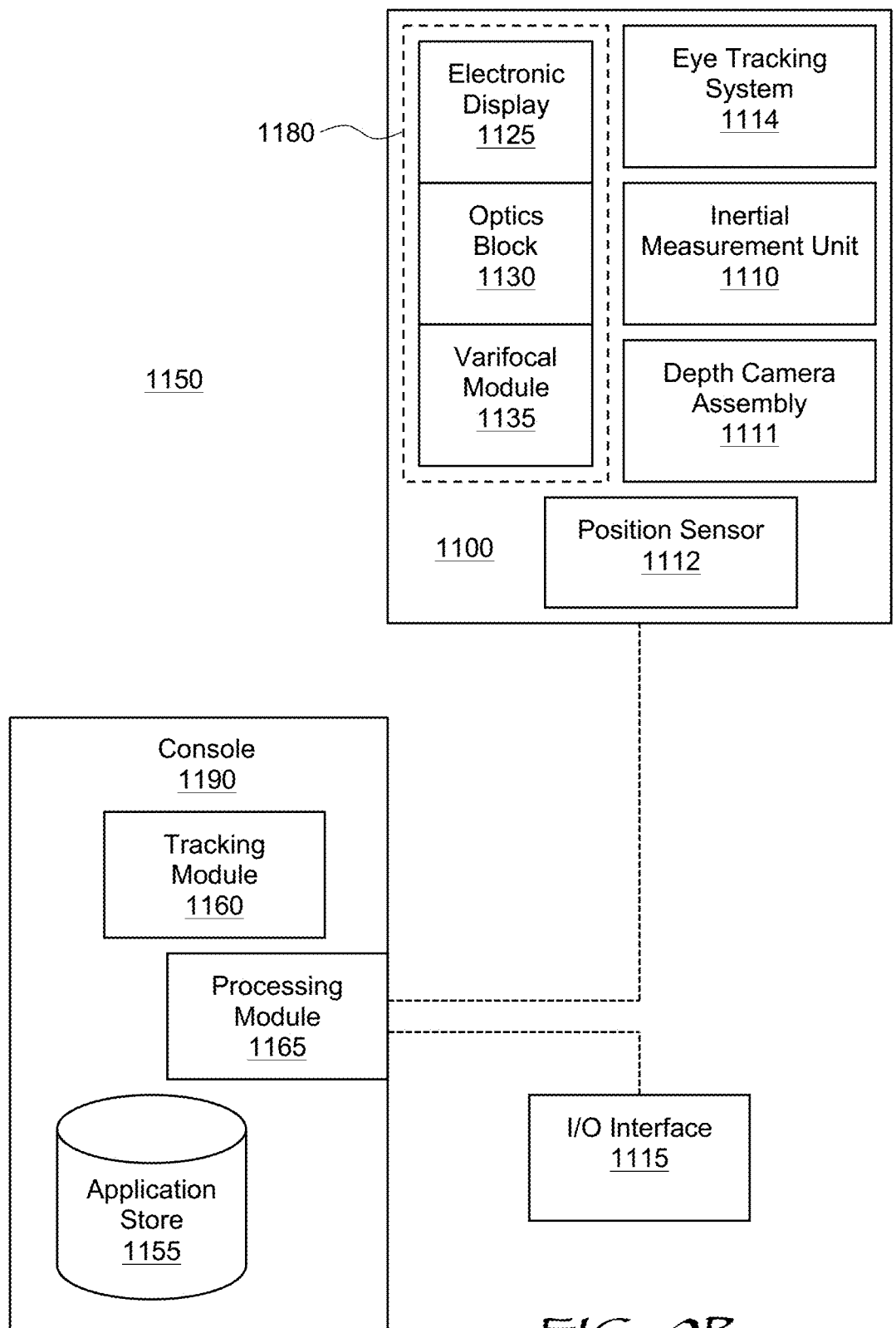
FIG. 9B is a block diagram of a virtual reality system including the headset of FIG. 9A.

Referring to FIG. 9B, an AR/VR system 1150 includes the HMD 1100 of FIG. 9A, an external console 1190 storing various AR/VR applications, setup and calibration procedures, 3D videos, etc., and an input/output (I/O) interface 1115 for operating the console 1190 and/or interacting with the AR/VR environment. The HMD 1100 may be "tethered" to the console 1190 with a physical cable, or connected to the console 1190 via a wireless communication link such as Bluetooth®, Wi-Fi, etc. There may be multiple HMDs 1100, each having an associated I/O interface 1115, with each HMD 1100 and I/O interface(s) 1115 communicating with the console 1190. In alternative configurations, different and/or additional components may be included in the AR/VR system 1150. Additionally, functionality described in conjunction with one or more of the components shown in FIGS. 11A and 11B may be distributed among the components in a different manner than described in conjunction with FIGS. 11A and 11B in some embodiments. For example, some or all of the functionality of the console 1115 may be provided by the HMD 1100, and vice versa. The HMD 1100 may be provided with a processing module capable of achieving such functionality.

As described above with reference to FIG. 9A, the HMD 1100 may include the eye tracking system 1114 (FIG. 9B) for tracking eye position and orientation, determining gaze angle and convergence angle, etc., the IMU 1110 for determining position and orientation of the HMD 1100 in 3D space, the DCA 1111 for capturing the outside environment, the position sensor 1112 for independently determining the position of the HMD 1100, and the display system 1180 for displaying AR/VR content to the user. The display system 1180 includes (FIG. 9B) an electronic display 1125, for example and without limitation, a liquid crystal display (LCD), an organic light emitting display (OLED), an inorganic light emitting display (ILED), an active-matrix organic light-emitting diode (AMOLED) display, a transparent organic light emitting diode (TOLED) display, a projector, or a combination thereof. The display system 1180 further includes an optics block 1130, whose function is to convey the images generated by the electronic display 1125 to the user's eye. The optics block may include various lenses, e.g. a refractive lens, a Fresnel lens, a diffractive lens, an active or passive Pancharatnam-Berry phase (PBP) lens, a liquid lens, a liquid crystal lens, etc., a pupil-replicating waveguide, grating structures, coatings, etc. The display system 1180 may further include a varifocal module 1135, which may be a part of the optics block 1130. The function of the varifocal module 1135 is to adjust the focus of the optics block 1130 e.g. to compensate for vergence-accommodation conflict, to correct for vision defects of a particular user, to offset aberrations of the optics block 1130, etc.

The I/O interface 1115 is a device that allows a user to send action requests and receive responses from the console 1190. An action request is a request to perform a particular action. For example, an action request may be an instruction to start or end capture of image or video data or an instruction to perform a particular action within an application. The I/O interface 1115 may include one or more input devices, such as a keyboard, a mouse, a game controller, or any other suitable device for receiving action requests and communicating the action requests to the console 1190. An action request received by the I/O interface 1115 is communicated to the console 1190, which performs an action corresponding to the action request. In some embodiments, the I/O interface 1115 includes an IMU that captures calibration data indicating an estimated position of the I/O interface 1115 relative to an initial position of the I/O interface 1115. In some embodiments, the I/O interface 1115 may provide haptic feedback to the user in accordance with instructions received from the console 1190. For example, haptic feedback can be provided when an action request is received, or the console 1190 communicates instructions to the I/O interface 1115 causing the I/O interface 1115 to generate haptic feedback when the console 1190 performs an action.

The console 1190 may provide content to the HMD 1100 for processing in accordance with information received from one or more of: the IMU 1110, the DCA 1111, the eye tracking system 1114, and the I/O interface 1115. In the example shown in FIG. 9B, the console 1190 includes an application store 1155, a tracking module 1160, and a processing module 1165. Some embodiments of the console 1190 may have different modules or components than those described in conjunction with FIG. 9B. Similarly, the functions further described below may be distributed among components of the console 1190 in a different manner than described in conjunction with FIGS. 11A and 11B.

The application store 1155 may store one or more applications for execution by the console 1190. An application is a group of instructions that, when executed by a processor, generates content for presentation to the user. Content generated by an application may be in response to inputs received from the user via movement of the HMD 1100 or the I/O interface 1115. Examples of applications include: gaming applications, presentation and conferencing applications, video playback applications, or other suitable applications.

The tracking module 1160 may calibrate the AR/VR system 1150 using one or more calibration parameters and may adjust one or more calibration parameters to reduce error in determination of the position of the HMD 1100 or the I/O interface 1115. Calibration performed by the tracking module 1160 also accounts for information received from the IMU 1110 in the HMD 1100 and/or an IMU included in the I/O interface 1115, if any. Additionally, if tracking of the HMD 1100 is lost, the tracking module 1160 may re-calibrate some or all of the AR/VR system 1150.

The tracking module 1160 may track movements of the HMD 1100 or of the I/O interface 1115, the IMU 1110, or some combination thereof. For example, the tracking module 1160 may determine a position of a reference point of the HMD 1100 in a mapping of a local area based on information from the HMD 1100. The tracking module 1160 may also determine positions of the reference point of the HMD 1100 or a reference point of the I/O interface 1115 using data indicating a position of the HMD 1100 from the IMU 1110 or using data indicating a position of the I/O interface 1115 from an IMU included in the I/O interface 1115, respectively. Furthermore, in some embodiments, the tracking module 1160 may use portions of data indicating a position or the HMD 1100 from the IMU 1110 as well as representations of the local area from the DCA 1111 to predict a future location of the HMD 1100. The tracking module 1160 provides the estimated or predicted future position of the HMD 1100 or the I/O interface 1115 to the processing module 1165.

The processing module 1165 may generate a 3D mapping of the area surrounding some or all of the HMD 1100 ("local area") based on information received from the HMD 1100. In some embodiments, the processing module 1165 determines depth information for the 3D mapping of the local area based on information received from the DCA 1111 that is relevant for techniques used in computing depth. In various embodiments, the processing module 1165 may use the depth information to update a model of the local area and generate content based in part on the updated model.

The processing module 1165 executes applications within the AR/VR system 1150 and receives position information, acceleration information, velocity information, predicted future positions, or some combination thereof, of the HMD 1100 from the tracking module 1160. Based on the received information, the processing module 1165 determines content to provide to the HMD 1100 for presentation to the user. For example, if the received information indicates that the user has looked to the left, the processing module 1165 generates content for the HMD 1100 that mirrors the user's movement in a virtual environment or in an environment augmenting the local area with additional content. Additionally, the processing module 1165 performs an action within an application executing on the console 1190 in response to an action request received from the I/O interface 1115 and provides feedback to the user that the action was performed. The provided feedback may be visual or audible feedback via the HMD 1100 or haptic feedback via the I/O interface 1115.

In some embodiments, based on the eye tracking information (e.g., orientation of the user's eyes) received from the eye tracking system 1114, the processing module 1165 determines resolution of the content provided to the HMD 1100 for presentation to the user on the electronic display 1125. The processing module 1165 may provide the content to the HMD 1100 having a maximum pixel resolution on the electronic display 1125 in a foveal region of the user's gaze. The processing module 1165 may provide a lower pixel resolution in other regions of the electronic display 1125, thus lessening power consumption of the AR/VR system 1150 and saving computing resources of the console 1190 without compromising a visual experience of the user. In some embodiments, the processing module 1165 can further use the eye tracking information to adjust where objects are displayed on the electronic display 1125 to prevent vergence-accommodation conflict and/or to offset optical distortions and aberrations.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

The present disclosure is not to be limited in scope by the specific embodiments described herein. Indeed, other various embodiments and modifications, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An illuminator comprising:
a slab of transparent material;
a semiconductor emitter chip for emitting a light beam;
a polarization-selective optical feedback element optically coupled to the semiconductor emitter chip for defining a polarization state of the light beam emitted thereby; and
a beam redirecting optic coupled to the polarization-selective optical feedback element for receiving and at least one of collimating or redirecting the light beam;
wherein the semiconductor emitter chip and the polarization-selective optical feedback element are immersed into the slab, the semiconductor emitter chip comprising a material different from the slab material.

2. The illuminator of claim 1, wherein the polarization-selective optical feedback element comprises a grating structure.

3. The illuminator of claim 1, wherein the polarization-selective optical feedback element comprises a plurality of polarization-selective resonators.

4. The illuminator of claim 1, wherein the polarization-selective optical feedback element has a spatial variation of at least one of thickness or refractive index, wherein the spatial variation is in a lateral direction with respect to a direction of propagation of the light beam.

5. The illuminator of claim 1, wherein the beam redirecting optic comprises at least one of: gallium phosphide, gallium arsenide, gallium nitride, indium phosphide, sapphire, or diamond; and wherein the semiconductor emitter chip comprises at least one of: a vertical-cavity surface-emitting laser (VCSEL), a superluminescent light-emitting diode (SLED), a laser diode (LD), or a light-emitting diode (LED).

6. The illuminator of claim 1, wherein the semiconductor emitter chip is configured to emit light of undefined polarization state in absence of the polarization-selective element.

7. The illuminator of claim 1, wherein the beam redirecting optic comprises at least one of a microlens or a tilted refractive surface, wherein the light beam propagated through the beam redirecting optic propagates at a different angle than the light beam emitted by the semiconductor emitter chip.

8. The illuminator of claim 1, wherein the semiconductor emitter chip comprises a vertical-cavity surface-emitting laser (VCSEL), and wherein the polarization-selective optical feedback element comprises a polarization-selective optical feedback element of the VCSEL.

9. The illuminator of claim 8, wherein the polarization-selective optical feedback element comprises a plurality of polarization-selective resonators.

10. The illuminator of claim 8, wherein the polarization-selective optical feedback element has a spatial variation of at least one of thickness or refractive index, wherein the spatial variation is in a lateral direction with respect to a direction of light propagation in the VCSEL.

11. The illuminator of claim 8, wherein the polarization-selective optical feedback element comprises a micro-structured metallization layer that reflects or absorbs light in a polarization-selective manner.

12. The illuminator of claim 8, wherein the VCSEL comprises an epitaxially grown structure comprising an active layer between optical feedback layers, wherein the polarization-selective optical feedback element is a part of the epitaxially grown structure.

13. The illuminator of claim 12, wherein the polarization-selective optical feedback element comprises a subwavelength grating at one of the optical feedback layers.

14. An eyebox illumination system for an eye tracking system, the eyebox illumination system comprising:
a substrate having a clear aperture for propagating light therethrough towards an eyebox; and
a plurality of illuminators supported by the substrate, each illuminator of the plurality of illuminators comprising:
a semiconductor emitter chip for emitting a light beam;
a polarization-selective element optically coupled to the semiconductor emitter chip for defining a polarization state of the light beam emitted thereby; and
a beam redirecting optic coupled to the semiconductor emitter chip for receiving and at least one of collimating or redirecting the light beam to illuminate an eye at the eyebox for tracking of the eye by the eye tracking system.

15. The eyebox illumination system of claim 14, wherein the semiconductor emitter chips and the beam redirecting optics of the plurality of illuminators are immersed into the substrate and are oriented to emit corresponding light beams towards the eyebox.

16. The eyebox illumination system of claim 14, wherein the semiconductor emitter chip is configured to emit light of undefined polarization state in absence of the polarization-selective element.

17. The eyebox illumination system of claim 14, wherein the semiconductor emitter chips of the plurality of illuminators are oriented in a same direction, and wherein the beam redirecting optics of the plurality if illuminators are configured to redirect corresponding light beams at different angles to propagate towards the eyebox.

18. The eyebox illumination system of claim 14, wherein the semiconductor emitter chip comprises a vertical-cavity surface-emitting laser (VCSEL), and wherein the polarization-selective element comprises a polarization-selective optical feedback element of the VCSEL.

19. An eye-tracking system comprising the eyebox illumination system of claim 14 and an eye-tracking camera disposed and configured to obtain an image of the eye when the eye is placed into the eyebox and illuminated by the eyebox illumination system.

\* \* \* \* \*